(12) United States Patent
Tateyama

(10) Patent No.: US 6,207,231 B1
(45) Date of Patent: Mar. 27, 2001

(54) COATING FILM FORMING METHOD AND COATING APPARATUS

(75) Inventor: Kiyohisa Tateyama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/066,603

(22) Filed: Apr. 27, 1998

(30) Foreign Application Priority Data

May 7, 1997 (JP) .................................................... 9-131616

(51) Int. Cl.[7] ............................... B05D 3/12; B05C 11/02
(52) U.S. Cl. .................... 427/240; 427/10; 427/385.5; 427/425; 118/52; 118/315; 118/320; 118/321
(58) Field of Search .................... 427/10, 240, 385.5, 427/425; 118/52, 320, 321, 315

(56) References Cited

U.S. PATENT DOCUMENTS

| | | | |
|---|---|---|---|
| 5,013,586 | 5/1991 | Cavazza | 427/240 |
| 5,571,560 * | 11/1996 | Lin | 427/240 |
| 5,626,913 * | 5/1997 | Tomoeda et al. | 427/240 |
| 5,658,615 * | 8/1997 | Hasebe et al. | 427/240 |
| 5,695,817 | 12/1997 | Tateyama et al. | 427/240 |
| 5,919,520 * | 7/1999 | Tateyama et al. | 427/240 |

\* cited by examiner

*Primary Examiner*—Shrive Beck
*Assistant Examiner*—Jennifer Calcagni
(74) *Attorney, Agent, or Firm*—Rader, Fishman & Grauer

(57) ABSTRACT

In forming a resist film by supplying a resist liquid onto a surface of an LCD substrate loaded in a rotation cup, a coating liquid is coated on the surface of the substrate by spraying the resist liquid onto the surface thereof while not rotating the substrate to thus form the coating film on the overall surface of the substrate, then the substrate is sealed into the rotation cup by closing the processing vessel by a lid member, and then a film thickness of the coating film is regulated by rotating the rotation cup and the substrate.

26 Claims, 6 Drawing Sheets

COATING FILM FORMING METHOD AND COATING APPARATUS

BACKGROUND OF THE INVENTION

The present invention relates to a coating film forming method and a coating apparatus capable of forming a liquefied coating film by virtue of a solvent such as a resist film, for example, on a surface of a liquid crystal display (LCD) substrate or a semi-conductor wafer.

In manufacturing the LCD substrate, for example, circuits can be formed by coating photoresist on the LCD substrate, then transferring circuit patterns onto the photoresist in terms of a photolithography technique, and then developing the photoresist. In these steps, a coating film forming step of supplying a coating liquid on a surface of the substrate is included.

In this case, as a method of forming a resist film, such a method has been known that, for example, a rectangular LCD substrate is loaded and fixed on a loading table provided in a processing vessel, then an opening portion of the processing vessel is closed by a lid member, then the processing vessel and the loading table are rotated together, then a resist liquid (coating liquid) consisting of a solvent and a photosensitive resin is dropped onto a center area of an upper surface of this substrate, and then the resist liquid is spread in a spiral fashion from a center portion of the substrate to a peripheral portion thereof by virtue of a rotating force and a centrifugal force of the substrate to thus be coated on the upper surface.

In this method, the resist liquid can be coated on the substrate by spreading the resist liquid from a center portion of the substrate to a peripheral portion thereof while rotating the substrate, so that a considerable amount of resist liquid has been scattered toward the processing vessel from an outer peripheral portion which has an extremely high peripheral velocity rather than the center portion thereof. In this case, out of the dropped resist liquid, an amount of the resist liquid coated on the substrate has 10 to 20%, and remaining 80 to 90% has scattered toward the processing vessel.

In particular, in the event that the resist liquid is coated on the rectangular LCD substrate, a very large quantity of the resist liquid has been wasted in order to coat the resist liquid on the overall surface of the substrate without surface areas left uncoated. In recent years, an increase in size of the LCD substrate has been progresses and as a result the waste of the resist liquid has been accelerated in the prior art.

BRIEF SUMMARY OF THE INVENTION

It is an object of the present invention to provide a coating film forming method and a coating apparatus which are capable of reducing an amount of to-be-used coating liquid as much as possible.

According to a first aspect of the present invention, there is provided a coating film forming method of forming a coating film by supplying a coating liquid onto a surface of a substrate which is loaded in a processing vessel, comprising the steps of:

(a) coating the coating liquid on the surface of the substrate by spraying the coating liquid onto the surface thereof while not rotating the substrate, to thus form the coating film; and (b) regulating a film thickness of the coating film while rotating the substrate.

According to a second aspect of the present invention, there is provided a coating film forming method of forming a coating film by supplying a coating liquid onto a surface of a substrate which is loaded in a processing vessel, comprising the steps of:

(A) coating the coating liquid on the surface of the substrate by spraying the coating liquid onto the surface thereof while not rotating the substrate;

(B) forming the coating film by spreading the coating liquid over the surface of the substrate while rotating the substrate at a first revolution speed; and (C) regulating a film thickness of the coating film while rotating the substrate which is sealed in the processing vessel, at a second revolution speed which is higher than the first revolution speed.

With the above configuration, the coating liquid can be supplied uniformly to the substrate without rotation of the substrate since the coating liquid is supplied to the substrate by spraying the coating liquid upon coating the coating liquid on the substrate and also scattering of the coating liquid due to a centrifugal force generated by the rotation of the substrate can be prevented since the substrate is not rotated. Therefore, an amount of consumed coating liquid can be extremely reduced since an amount of coating liquid necessary for coating the overall surface of the substrate can be reduced and the wasteful coating liquid scattered to the periphery can be lessened. In particular, if a size of the substrate is increased, the centrifugal force due to rotation of the peripheral portion of the substrate is enlarged so that a probability to scatter the coating liquid becomes higher. Hence, from a viewpoint of saving the coating liquid, it is effective that the coating liquid can be sprayed without the rotation of the substrate.

In addition, if the coating liquid is spread on the surface of the substrate by rotating the substrate at the first lower revolution number as in the second aspect, the coating liquid can be coated more firmly on the overall surface of the substrate without uncoated surface area. In this case, since the coating liquid can be supplied onto the substantially entire surface of the substrate by spraying the coating liquid, the large centrifugal force required to coat the coating liquid on the overall surface of the substrate is not needed. Accordingly, scattering of the coating liquid can be suppressed to the lowest minimum rather than the case where the coating liquid is spread on the overall surface of the substrate only by virtue of the rotation of the substrate.

According to a third aspect of the present invention, there is provided a coating film forming method of forming a coating film by supplying a coating liquid onto a surface of a substrate which is loaded in a processing vessel, comprising the steps of:

(1) coating a solvent on the surface of the substrate;

(2) coating the coating liquid onto the surface of the substrate by spraying the coating liquid onto the surface thereof, to thus form the coating film; and (3) regulating a film thickness of the coating film by rotating the substrate.

According to a fourth aspect of the present invention, there is provided a coating film forming method of forming a coating film by supplying a coating liquid onto a surface of a substrate which is loaded in a processing vessel, comprising the steps of:

(I) coating a solvent on the surface of the substrate;

(II) coating the coating liquid onto the surface of the substrate by spraying the coating liquid onto the surface of the substrate;

(III) forming the coating film by spreading the coating liquid on the surface of the substrate while rotating the substrate at a first revolution speed; and (IV) regulating a film thickness of the coating film by rotating the substrate which is sealed in the processing vessel, at a second revolution speed which is higher than the first revolution speed.

According to these third and fourth aspects, since the solvent is coated on the surface of the substrate prior to supply of the coating liquid, the coating liquid can be spread over the surface of the substrate via the solvent when the coating liquid is sprayed on the surface of the substrate. Accordingly, the coating liquid can be coated on the overall surface of the substrate without unevenness and an amount of the coating liquid can be reduced much more.

The above coating method further comprises the step of sealing the substrate into the processing vessel by closing the processing vessel by use of the lid member after the coating film has been formed on the surface of the substrate, and then the step of regulating a film thickness is carried out. Therefore, uniformity of the film thickness can be improved.

Further, since at least one of the solvent and the coating liquid is coated on the surface of the substrate while rotating the substrate and the processing vessel at the first revolution number, a spreading effect of the coating liquid can be improved so that the coating liquid can be coated without unevenness. In this case, since the solvent is supplied, the coating liquid can be spread sufficiently even when the first revolution number is not so large.

Furthermore, since coating of the solvent is carried out by spraying the solvent, the solvent can be coated uniformly on the surface of the substrate even by a less amount of the solvent. More over, closing of the processing vessel during the rotation can be facilitated by rotating the substrate as well as the processing vessel. Still more, since means for spraying the coating liquid is moved while not rotating the substrate when the coating liquid is coated onto the substrate by spraying the coating liquid to the surface of the substrate, the coating liquid can be coated sufficiently on the overall surface of the substrate even when a large size substrate is employed.

According to a fifth aspect of the present invention, there is provided a coating apparatus for forming a coating film by supplying a coating liquid onto a surface of a substrate which is loaded in a processing vessel, comprising:

a processing vessel formed like a cup shape with an opening portion so as to surround the substrate;

a supporting means for supporting the substrate in a state where the surface of the substrate is kept horizontally;

a substrate rotating means for rotating the substrate by rotating the supporting means;

a coating liquid spraying means for spraying the coating liquid onto the surface of the substrate; and a scanning means for scanning the coating liquid spraying means along the surface of the substrate.

In this fashion, since the coating liquid is supplied to the substrate by spraying the coating liquid, such coating liquid is ready to spread over the whole substrate. And, since the scanning means for scanning the coating liquid spraying means to spray the coating liquid on the surface of the substrate along the surface of the substrate is provided, the coating liquid can be coated sufficiently on the overall surface of the substrate even when the large size substrate is employed.

According to a sixth aspect of the present invention, there is provided a coating apparatus for forming a coating film by supplying a coating liquid onto a surface of a substrate which is loaded in a processing vessel, comprising:

a processing vessel formed like a cup shape with an opening portion so as to surround the substrate;

a supporting means for supporting the substrate in a state where the surface of the substrate is kept horizontally;

a substrate rotating means for rotating the substrate by rotating the supporting means;

a coating liquid spraying means for spraying the coating liquid onto the surface of the substrate; and a solvent supplying means for supplying a solvent for the coating liquid onto the surface of the substrate.

Like the above, since there is provided the solvent supplying means for supplying the solvent for the coating liquid onto the surface of the substrate, the coating liquid can be coated by spreading the coating liquid via the solvent on the surface of the substrate. As a result, the coating liquid can be coated on the overall surface of the substrate without unevenness and an amount of consumed coating liquid can be reduced much more. In this apparatus, since the scanning means for scanning the coating liquid spraying means along the surface of the substrate is provided, the solvent can be coated over all the surface of the substrate even when the large size substrate is employed and an amount of the solvent can be extremely reduced.

In the above apparatus, since the solvent supplying means supplies the solvent by spraying it, the solvent can be uniformly coated on the surface of the substrate even by a less amount of the solvent. In this event, since the apparatus further comprises a solvent cover for covering the solvent supplying means, scattering of sprayed solvent to the surrounding areas can be prevented. The exhaust portion can be provided in the solvent cover to exhaust the air in the cover. Further, scattering of the coating liquid to the surrounding areas can be prevented by providing a coating liquid cover for covering the coating liquid spraying means. In this case, generation of particles due to dried coating liquid can be prevented by providing the cleaning means for cleaning the inside of the coating liquid cover. Also, the exhaust portion can be provided in the coating liquid cover to exhaust the air in the cover.

In the above apparatus, since the coating liquid spraying means including a plurality of coating liquid spraying portions is provided, the coating liquid can be coated more effectively over all the surface of the substrate even when the large size substrate is employed. Since the apparatus further comprises the lid member for closing the opening portion of the processing vessel, the substrate can be sealed in the processing vessel by closing the processing vessel by the lid member after the coating liquid has been formed on the surface of the substrate, so that uniformity of the film thickness can be improved. Still more, since the apparatus further comprises the vessel rotating means for rotating the substrate together with the processing vessel, sealing of the processing vessel during rotation can be made easy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be explained in detail with reference to the accompanying drawings hereinafter.

Figure 1:
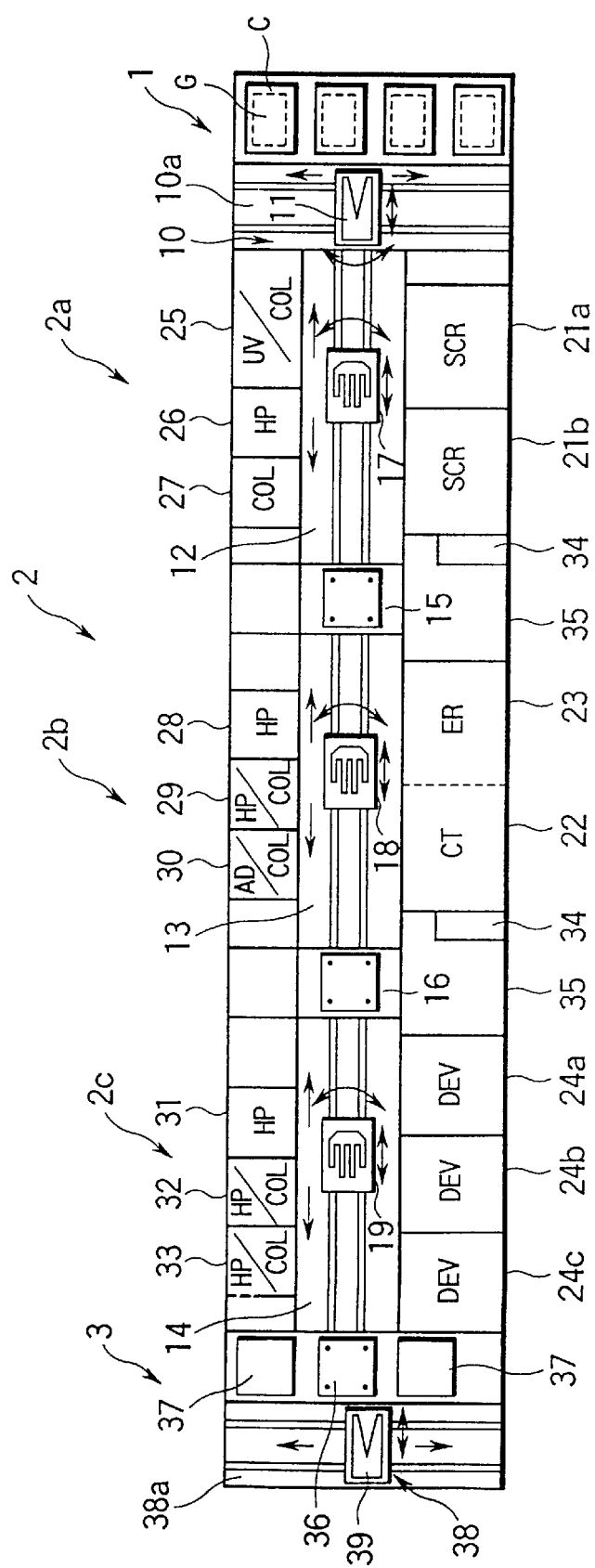
FIG. 1 is a plan view showing a resist coating/developing system to which a coating film forming method and a coating apparatus as objectives of the present invention is applied.

FIG. 1 is a plan view showing an LCD substrate coating/developing process system to which the present invention is applied.

This coating/developing process system comprises a cassette station 1 in which a cassette C to incorporate a plurality of substrates G therein is loaded, a process section 2 including a plurality of processing units which apply a series of processes including coating/developing of resist to the substrates G, and an interface section 3 for transferring the substrate G between the coating/developing process system and an exposure unit (not shown). The cassette station 1 and the interface section 3 are provided to both ends of the process section 2 respectively.

The cassette station 1 comprises a carrying mechanism 10 for carrying an LCD substrate between the cassette C and the process section 2. Loading/unloading the cassette C into/from the cassette station 1 is then carried out. In addition, the carrying mechanism 10 comprises carrying arms 11 which are movable on carrying paths 10a provided along an alignment direction of the cassettes, and the substrate G can be carried between the cassette C and the process section 2 by virtue of the carrying arms 11.

The process section 2 is divided into a front stage portion 2a, an intermediate stage portion 2b, and a rear stage portion 2c, in which carrying paths 12, 13, 14 are provided in their central areas respectively and processing units are arranged on both sides of these carrying paths respectively. Relay portions 15, 16 are provided between the front stage portion 2a, the intermediate stage portion 2b, and the rear stage portion 2c respectively.

The front stage portion 2a comprises a main carrying unit 17 which is movable along the carrying path 12. Two scrubbing units (SCR) 21a, 21b are provided to one end side of the carrying path 12, while an ultraviolet irradiating/cooling unit (UV/COL) 25 and a heating unit (HP) 26 and a cooling unit (COL) 27, both being stacked as two upper and lower stages respectively, are provided to the other end side of the carrying path 12.

Then, the intermediate stage portion 2b comprises a main carrying unit 18 which is movable along the carrying path 13. A resist coating unit (CT) 22 and a peripheral resist removing unit (ER) 23 which can remove the resist on the peripheral portion of the substrate G are provided integrally to one end side of the carrying path 13, whereas heating units (HP) 28 which are stacked as two stages vertically, a heating/cooling unit (HP/COL) 29, in which the heating unit and the cooling unit are stacked vertically, and an adhesion/cooling unit (AD/COL) 30, in which an adhesion unit and a cooling unit are stacked vertically, are provided to the other end side of the carrying path 13.

In addition, the rear stage portion 2c comprises a main carrying unit 19 which is movable along the carrying path 14. Three developing units 24a, 24b, 24c are provided to one end side of the carrying path 14, while heating units 26, which are stacked as two stages vertically, and two heating/cooling units (HP/COL) 32, 33, in which a heating process unit and a cooling process unit are vertically stacked respectively, are provided to the other end side of the carrying path 14.

The process section 2 is so constructed that spinner system units such as the scrubbing unit 21a, a resist coating unit 22a, a developing unit 24a, etc. are arranged on one side of the carrying path, while only thermal process units such as the heating unit, the cooling unit, etc. are arranged on the other side of the carrying path.

The main carrying units 17, 18, 19 comprise an X-axis driving mechanism and a Y-axis driving mechanism in two horizontal directions of a horizontal surface and a Z-axis driving mechanism in the vertical direction respectively, and comprises a rotation driving mechanism for driving around the Z-axis.

The main carrying unit 17 has functions of transferring/receiving the substrate G to/from the arms 11 of the carrying mechanism 10, and loading/unloading the substrate G into/from respective process units in the front stage portion 2a, and transferring/receiving the substrate G to/from the relay unit 15. Also, the main carrying unit 18 has functions of transferring/receiving the substrate G to/from the relay unit 15, and loading/unloading the substrate G into/from respective process units in the intermediate stage portion 2b, and transferring/receiving the substrate G to/from the relay unit 16. In addition, the main carrying unit 19 has functions of transferring/receiving the substrate G to/from the relay unit 16, loading/unloading the substrate G into/from respective process units in the rear stage portion 2c, and transferring/receiving the substrate G to/from the interface section 3. The relay units 15, 16 can also act as a cooling plate respectively.

The interface section 3 comprises an extension 36 for holding the substrate temporarily when the substrate is transferred/received to/from the process section 2, two buffer stages 37 which are provided on both sides of the extension 36 and in which buffer cassettes are arranged, and a carrying mechanism 38 for carrying the substrate G between the extension 36/two buffer stages 37 and an exposure unit (not shown). The carrying mechanism 38 includes a carrying arm 39 which is movable on carrying paths 38a provided along the alignment direction of the extension 36 and the buffer stages 37. The substrate G can be carried between the process section 2 and the exposure unit by the carrying arm 39.

Like the above, space saving and improvement in the efficiency of the process can be achieved by incorporating respective process units together.

In the coating/developing process system as constructed above, the substrate G in the cassette C is carried into the process section 2. Then, in the process section 2, first the substrate G is subjected to surface modifying/cleaning process in the ultraviolet irradiating/cooling unit (UV/COL) 25 and then to scriber cleaning process in the scrubbing units (SCR) 21a, 21b after the substrate has been cooled, then is dried by heating operation in the heating process unit (HP) 26, and then is cooled in the cooling unit (COL) 27.

After this, the substrate G is carried to the intermediate stage portion 2b and then to hydrophobicity process (HMDS process) in the upper stage adhesion unit (AD) of the unit 30 in order to enhance a fixing property of the resist. Then, the substrate G is cooled in the cooling unit (COL) and then coated with the resist in the resist coating unit (CT) 22. Then, extra resist on the peripheral portion of the substrate G is removed in the peripheral resist removing unit (ER) 23. Then, the subject G is subjected to prebake process in the heating process unit (HP) in the intermediate stage portion 2b and then is cooled in the lower stage cooling unit (COL) in the unit 29 or 30.

Thereafter, the substrate G is carried by the main carrying unit 19 from the relay portion 16 to the exposure unit via the interface section 3, and then predetermined patterns are exposed on the substrate G. Then, the substrate G is carried again via the interface section 3 and then is developed in any of the developing process units (DEV) 24a, 24b, 24c to form predetermined patterns thereon. The developed substrate G is subjected to postbake process in any of the heating unit (HP), then is cooled in the cooling unit (COL), and then is put in the predetermined cassette on the cassette station 1 by virtue of the main carrying units 19, 18, 17 and the carrying mechanism 10.

Next, a resist coating unit 25 to which a coating film forming method and a coating apparatus of the present invention are applied will be explained.

Figure 2:
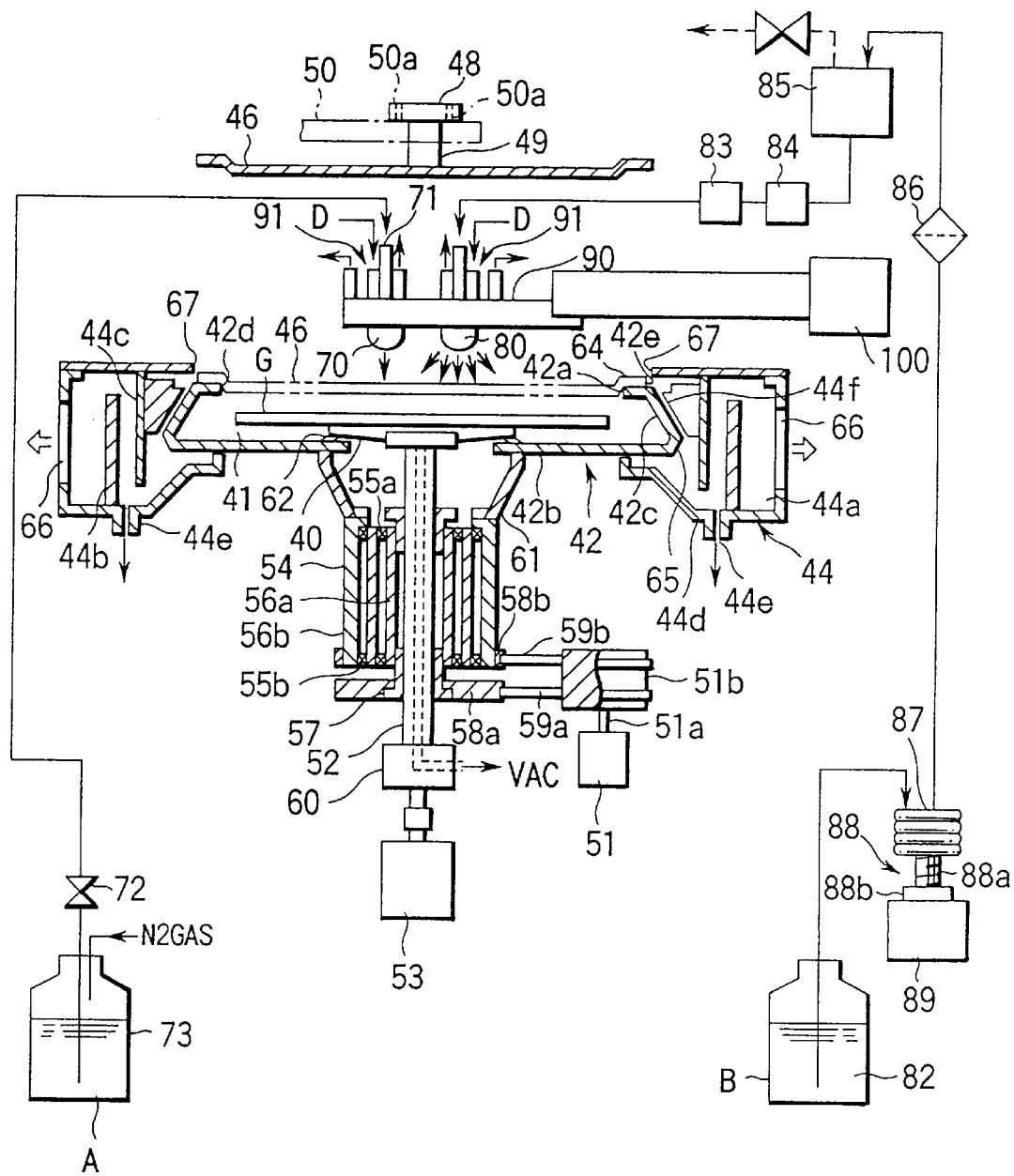
FIG. 2 is a sectional view showing a resist coating unit serving as a coating apparatus which is applied to embody the coating film forming method of the present invention.

FIG. 2 shows the resist coating unit 25 serving as a coating apparatus according to an embodiment of the present invention. The resist coating unit 25 comprises a spin chuck 40 for holding the LCD substrate rotatably in a horizontal state by use of vacuum suction, a cup-shaped rotatable processing vessel (rotation cup) 42 whose upper portion 42a is opened and whose process chamber 41 surrounds an upper portion and an outer peripheral portion of this spin chuck 40, a lid member 46 attached detachably to the rotation cup 42 so as to close the opened portion 42a of the rotation cup 42, a robot arm 50 for carrying the lid member 46 between a close position and a standby position, a hollow ring-like drain cup 44 arranged to surround an outer peripheral side of the rotation cup 42, a drive motor 51 for rotating the spin chuck 40 and the rotation cup 42, an injection head 90 provided movably over the spin chuck 40, and a moving mechanism 100 for holding the injection head 90 to transfer it between a standby position of the injection head and a position over the substrate. The injection head 90 has such a configuration that a solvent supply nozzle 70 for supplying a solvent A (e.g., thinner) for the coating liquid and a coating liquid supply nozzle 80 for supplying a resist liquid B as the coating liquid are provided integrally in close vicinity.

To a solvent supply path reaching a nozzle 70 and a resist liquid supply path reaching a nozzle 80 are provided respective temperature adjusting mechanisms 91 which can circulate a temperature adjusting liquid D to set the solvent B and the resist liquid B flowing through respective supply paths at a predetermined temperature (for example, 23° C.).

The spin chuck 40 is formed of heat resistant synthetic resin such as polyetheretherketone (PEEK) and can be operated based on a program set previously. The spin chuck 40 can be rotated (rotated on its own axis) horizontally by a rotation axis 52 which is rotated by a drive motor 51 whose rotational speed can be variably controlled. The spin chuck 40 can also be moved vertically by an operation of an elevating cylinder 53 which is connected to the rotation axis 52. In this case, the rotation axis 52 is coupled to a spline bearing 57 slidably in a vertical direction. The spline bearing 57 is fitted into an inner peripheral surface of a rotating inner cylinder 56a which is fitted rotatably to an inner peripheral surface of a stationary collar 54 via a bearing 55a. A driven pulley 58a is mounted on the spline bearing 57. A belt 59a is put around the driven pulley 58a and a driving pulley 51b which is coupled to a driving axis 51a of the drive motor 51. Hence, the rotation axis 52 is rotated by an operation of the drive motor 51 via the belt 59a to thus rotate the spin chuck 40. A lower portion of the rotation axis 52 is inserted into a not-shown cylinder body and then the rotation axis 52 is coupled to the elevating cylinder 53 via a vacuum sealing portion 60 in the cylinder body. The rotation axis 52 can be moved vertically by an operation of the elevating cylinder 53, so that the spin chuck 40 can be moved vertically.

A connecting cylinder 61 is connected to an upper end portion of an outer rotating cylinder 56b which is fitted to an outer peripheral surface of the stationary collar 54 via a bearing 55b. The rotation cup 42 is secured via this connecting cylinder 61. A bearing 52 having a sealing function is interposed between a bottom portion 42b of the rotation cup 42 and a lower surface of the spin chuck 40, so that the rotation cup 42 can rotated relatively with respect to the spin chuck 40. The driven pulley 58b is fitted to the outer rotating cylinder 56b. A belt 59b is put around the driven pulley 58b and the driving pulley 51b connected to the drive motor 51. Therefore, a driving force of the drive motor 51 can be transferred to the rotation cup 42 via the belt 59b to thus rotate the rotation cup 42.

In this case, since a diameter of the driven pulley 58b is formed identically to that of the driven pulley 58a mounted on the rotation axis 52 and both the belts 59a, 59b are put around the common pulley 51b of the motor 51, the rotation cup 42 and the spin chuck 40 can be synchronized at the same rotational speed.

The rotation cup 42 has a side wall 42c whose diameter is reduced upwardly such that the side wall 42c can constitute a taper surface 42e. An inward flange 42d is formed toward the inside on an upper end of the side wall 42c. Air supply holes 64 are provided in the inward flange 42d of the rotation cup 42 at an appropriate interval along its peripheral direction. Exhaust holes 65 are provided in appropriate positions of a lower portion of the side wall 42c along its peripheral direction. Since the air supply holes 64 and the exhaust holes 65 are provided in this manner, the air flowing from the air supply holes 64 to the processing chamber 41 can flow through from the exhaust holes 65 to the outside when the rotation cup 42 is rotated. Hence, the processing chamber 41 can be prevented from becoming negative pressure when the rotation cup 42 is being rotated, so that a large force is not needed to lift up the lid member 46 from the rotation cup 42 after the process has been completed and thus the lid member 46 can be easily released.

On the contrary, an annular passage 44a is provided in the inside of the drain cup 44 and exhaust ports 66 are provided at appropriate locations (e.g., four locations along its peripheral direction) on an outer peripheral wall of the drain cup 44. The exhaust ports 66 are connected to an exhaust apparatus (not shown). A radial exhaust passage 67 being connected to the annular passage 44a and the exhaust ports 66 is formed in an upper inner peripheral portion of the drain cup 44. In this manner, if the exhaust ports 66 are provided on the outer peripheral portion of the drain cup 44 and the radial exhaust passage 67 is formed in the upper inner peripheral portion of the drain cup 44, mists which have been scattered by virtue of a centrifugal force into the processing chamber 41 during rotating processing and then have flown into the drain cup 44 via the air supply holes 64 can be prevented from being blown up toward an upper side of the rotation cup 42, and consequently the mists can be exhausted from the exhaust ports 66 to the outside.

The annular passage 44a is partitioned by an outside wall 44b which stands up from a bottom portion of the drain cup 44 and an inside wall 44c which hangs down from a ceiling portion of the drain cup 44, so that exhaust can be executed uniformly because a detour is formed. In addition, drain holes 44e are provided on a bottom portion 44d, which is located between the outside wall 44b and the inside wall 44c, at an appropriate distance along the peripheral direction.

A taper surface 44f which has a taper corresponding to the taper surface 42e of the rotation cup 42 is formed on an inner peripheral surface of the drain cup 44. Thus an infinitesimal clearance can be formed between the taper surface 42e of the rotation cup 42 and the taper surface 44f of the drain cup 44. If the taper infinitesimal clearance which extends to downward is formed in this fashion, pressure difference can be induced due to difference in peripheral velocities which are caused between upper and lower portions of the infinitesimal clearance during rotation of the rotation cup 42. Hence, since such pressure difference can accelerate an airflow which is directed from the upper side of the infinitesimal clearance on the outer peripheral portion of the rotation cup 42 to the lower side thereof, the exhaust mists in the drain cup 44 can be prevented from scattering to the outside of the rotation cup 42 via the infinitesimal clearance.

Further, even though the mists are going to rise upward via the infinitesimal clearance and then scatter to the outside of the rotation cup 42, they can be exhausted from the exhaust ports 66 via the radial exhaust passage 67 and the annular passage 44a provided in the drain cup 44.

The case where the drain cup 44 is provided to surround the outer peripheral portion of the rotation cup 42 has been explained herein, but there is no necessity that the drain cup 44 should be always arranged on the outer peripheral side of the rotation cup 42. The drain cup 44 may be arranged on the lower side of the rotation cup 42.

A supporting member 49 extending upwardly is provided in a central area of an upper surface of the lid member 46. A head portion 48 which has a large diameter rather than the supporting member 49 is provided to an upper end of the supporting member 49. In order to open and close the lid member 46, as indicated by a chain double-dashed line in FIG. 2, a robot arm 50 is inserted below the head portion 48 which provided on the upper surface of the lid member 46 via the supporting member 49, then engaging pins 50a which are projected from the robot arm 50 are engaged with an engaging groove provided on the head portion 48, and then the robot arm 50 is moved upward/downward.

It is possible to place a baffle plate (not shown), which is fitted to the lid member 46 at its center portion and is formed of a perforated board having a larger size than the substrate G, etc., in an intermediate position between the lid member 46 and the substrate G. During the coating process, generation of turbulent flows in the processing chamber 41 can be prevented more firmly by providing such baffle plate.

The solvent supply nozzle 70 is connected to a solvent tank 73 via a solvent supply tube 71 as a solvent supply path and a switching valve 72. When a nitrogen ($N_2$) gas is supplied to an inside of the solvent tank 73, the solvent A in the solvent tank 73 can be supplied onto the substrate G by a pressurization force of the $N_2$ gas. In this case, a flow rate of the solvent A can be controlled by controlling the pressurization force of the $N_2$ gas, and a predetermined amount of solvent A can be supplied for a predetermined time. The solvent supply nozzle may be formed to spray the solvent.

The resist liquid supply nozzle 80 has a plurality of microholes to spray the resist liquid. The resist liquid supply nozzle 80 is connected to a resist liquid tank 83 (coating liquid supply source) for storing the resist liquid B via a resist liquid supply tube 81 as a resist liquid supply path. In the resist liquid supply tube 81, a suck-back valve 83, an air operation valve 84, a vapor removing mechanism 85 for separating/removing the vapor from the resist liquid B, a filter 86, and a bellows pump 87 are provided sequentially. The bellows pump 87 can be expanded/contracted by a driving portion. By controlling such expansion/contraction, a predetermined amount of resist liquid B can be sprayed from the resist liquid supply nozzle 80 onto a surface of the substrate G. This bellows pump 87 allows to control a small supply amount of the resist liquid B rather than the conventional supply amount of the resist liquid B. The driving portion comprises a ball screw mechanism 88 consisting of a screw 88a whose one end is secured to one end of the bellows pump 87 and a nut 88b which is engaged with the screw 88a, and a stepping motor 89 for rotating the nut 88b to move the screw 88a linearly.

The suck-back valve 83 is provided in the resist liquid supply system to pull back the resist liquid B, which remains on an inner wall portion of a top end of the resist liquid supply nozzle 80 by virtue of surface tension after the resist liquid has been discharged from the resist liquid supply nozzle 80, into the resist liquid supply nozzle 80, whereby solidification of residual resist liquid can be prevented. In this case, in the resist liquid supply nozzle 80 which can discharge a small amount of resist liquid B, if the resist liquid B is pulled back into the resist liquid supply nozzle 80 by means of negative pressure action generated by the suck-back valve 83 as in usual cases, the air around the top end of the resist liquid supply nozzle 80 is also drawn into the nozzle 80 together with the resist liquid and therefore residue of the resist liquid B stuck to the top end of the nozzle 80 enters into the nozzle 80. As a result, not only clogging of the nozzle 80 may be caused but also particles of the dried resist may contaminate the substrate G to thus result in the reduction in yield.

Figure 3:
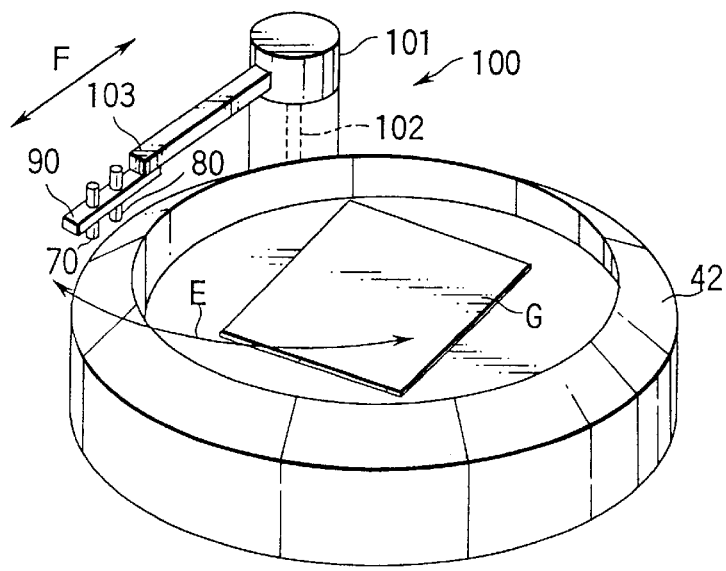
FIG. 3 is a perspective view showing a method of scanning a resist liquid supply nozzle in the resist coating unit shown in FIG. 2.

The injection head 90 is provided to be moved by the moving mechanism 100. More particularly, as shown in FIG. 3, the moving mechanism 100 is mainly composed of a supporting member 101 for supporting the injection head 90, a rotating shaft 102 for supporting the supporting member 101 rotatably and back/forth movably, and a driving means (not shown) for driving the supporting member 101. According to this configuration, the injection head 90 provided to the supporting member 101 can be rotated in a direction indicated by an arrow E in FIG. 3 with the use of the rotation shaft 102 as the axis of rotation and can also be moved back and forth in a direction indicated by an arrow F in FIG. 3.

While moving the injection head 90 along the directions indicated by arrows E and F, the resist liquid and the solvent can be supplied from the solvent supply nozzle 70 and the resist liquid supply nozzle 80 to the substrate G.

A first method of coating the resist liquid on the surface of the substrate G by the coating apparatus having the above configuration will be explained.

First, the lid member 46 of the rotation cup 42 is opened, then the substrate G is carried on the spin chuck 40 in a stationary state by a not-shown carrying arm, and then the substrate G is held on the spin chuck 40 in terms of vacuum suction.

Under this condition, while moving the injection head 90 by rotating the supporting member 101 around the rotation shaft 102 in the direction indicated by the arrow E in FIG. 3 by the moving mechanism 100, the resist liquid is sprayed from the resist liquid supply nozzle 80 toward the substrate G which is not rotated. Then, after the resist liquid has been sprayed, such resist liquid is coated on the overall surface of the substrate G without unevenness by moving back and forth the supporting member 101 in the direction indicated by the arrow F to form a resist film on the overall surface of the substrate G. Upon spraying the resist liquid, the substrate G together with the rotation cup 42 may be rotated at lower speed (first revolution speed: 100 to 600 rpm, for example, acceleration: 300 to 500 rpm/sec) than the steady-state rotation at the time of process.

Next, supply of the resist liquid is halted, then the resist liquid supply nozzle 80 is moved to its standby position, then the lid member 46 is put on the upper opening portion 42a of the rotation cup 42 by the robot arm 50 to thus seal the substrate G in the rotation cup 42.

In the state where the opening portion 42a of the rotation cup 42 is closed by the lid member 46 to seal the rotation cup 42 in this manner, a thickness of the resist film is regulated by rotating the spin chuck 40 and the rotation cup 42 (second revolution speed: 1350 rpm, for example, acceleration: 500 rpm/sec). In this event, it is preferable that the second revolution number should be set to a value higher than the first revolution number.

After the coating process has been completed, the rotation of the spin chuck 40 and the rotation cup 42 is terminated. Then, the lid member 46 is moved to its standby position by use of the robot arm 50, and then the substrate G is taken out by the not-shown carrying arm. Thus, the coating operation has been finished.

In turn, a second method of coating the resist liquid on the surface of the substrate G by the coating apparatus constructed as above will be explained.

First, the lid member 46 of the rotation cup 42 is opened, then the substrate G is carried on the spin chuck 40 in the stationary state by the not-shown carrying arm, and then the substrate G is held on the spin chuck 40 in terms of vacuum suction.

Under this condition, the spin chuck 40 is rotated, then the substrate G is rotated at lower speed (first revolution speed: 100 to 600 rpm, for example, acceleration: 300 to 500 rpm/sec) than the steady-state rotation at the time of process and at the same time the rotation cup 42 is rotated at the same rotational speed. During this rotation, ethyl cellosolve acetate (ECA), for example, as the solvent A for the coating liquid is supplied (e.g., dropped) by 26.7 cc, for example, from the solvent supply nozzle 70 of the injection head 90, which has been grasped by the supporting member 101 and moved over the center portion of the substrate G by the moving mechanism 100, onto the surface of the substrate G.

Alternatively, the solvent A may be dropped on to the standstill substrate G which is not rotated and then the substrate G may be rotated.

After the solvent A has been supplied in this manner, supply of the solvent A is halted in the state where the revolution number of the spin chuck 40 and the rotation cup 42 is maintained at the low revolution number, and then rotation of the spin chuck 40 and the rotation cup 42 is terminated.

In this state, while moving the injection head 90 by rotating the supporting member 101 around the rotation shaft 102 in the direction indicated by the arrow E in FIG. 3 by the moving mechanism 100, the resist liquid B is sprayed from the resist liquid supply nozzle 80 toward the substrate G. Then, the resist liquid B is coated on the overall surface of the substrate G without unevenness by moving back and forth the supporting member 101 in the direction indicated by the arrow F while spraying the resist liquid B to thus form the resist film on the overall surface of the substrate G. The resist liquid B may be sprayed while maintaining the rotation of the spin chuck 40 and the rotation cup 42 used when the solvent A is supplied.

After the resist liquid B has been sprayed in this fashion, supply of the resist liquid is halted and simultaneously the rotation of the spin chuck 40 and the rotation cup 42 is halted. Thereafter, supply of the resist liquid is stopped, then the resist liquid supply nozzle 80 is moved to its standby position, and then the lid member 46 is put on the upper opening portion 42a of the rotation cup 42 by use of the robot arm 50 to thus seal the substrate G in the rotation cup 42.

In the state where the opening portion 42a of the rotation cup 42 is closed by the lid member 46 to thus seal the rotation cup 42 in this manner, a thickness of the resist film is regulated by rotating the spin chuck 40 and the rotation cup 42 (second revolution speed: 1350 rpm, for example, acceleration: 500 rpm/sec). In this case, it is preferable that the second revolution speed should be set to a value higher than the first revolution speed.

After the coating process has been completed, the rotation of the spin chuck 40 and the rotation cup 42 is terminated. Then, the lid member 46 is moved to its standby position by use of the robot arm 50, and then the substrate G is taken out by the not-shown carrying arm. Thus, the coating operation has been finished.

Since the resist liquid can be supplied uniformly onto the substrate G by spraying the resist liquid with the above, an amount of the resist liquid required to be coated on the whole surface of the substrate G can be reduced.

In addition, if the substrate G is set not to be rotated in spraying the resist liquid onto the surface of the substrate G, scattering of the resist liquid due to a centrifugal force generated by the rotation of the substrate G can be prevented. Therefore, an amount of wasteful resist can be lessened, so that an amount of consumed resist can be extremely reduced.

Further, since the resist liquid is spread on the surface of the substrate G by rotating the substrate G at the first low revolution speed in spraying the resist liquid, the resist liquid can be coated more firmly on the overall surface of the substrate G without uncoated surface areas.

Furthermore, since the solvent A is coated on the surface of the substrate G prior to spray of the resist liquid, the resist liquid can be spread over the surface of the substrate G via the solvent A when the resist liquid is sprayed. For this reason, the resist liquid can be coated without unevenness on the overall surface of the substrate G.

Besides, because the resist liquid is sprayed on the surface of the substrate G while moving the supporting member 101 in the state where the substrate G is not rotated as described above, the coating liquid can be sufficiently coated on the overall surface of the substrate even though a large size of the substrate is employed. In addition, since a mechanism for rotating the rotation cup 42 together upon rotating the substrate G has been employed, hermetic sealing of the substrate in the processing vessel can be facilitated during the rotation.

Subsequently, another example of the resist liquid supply nozzle will be explained.

Figure 4:
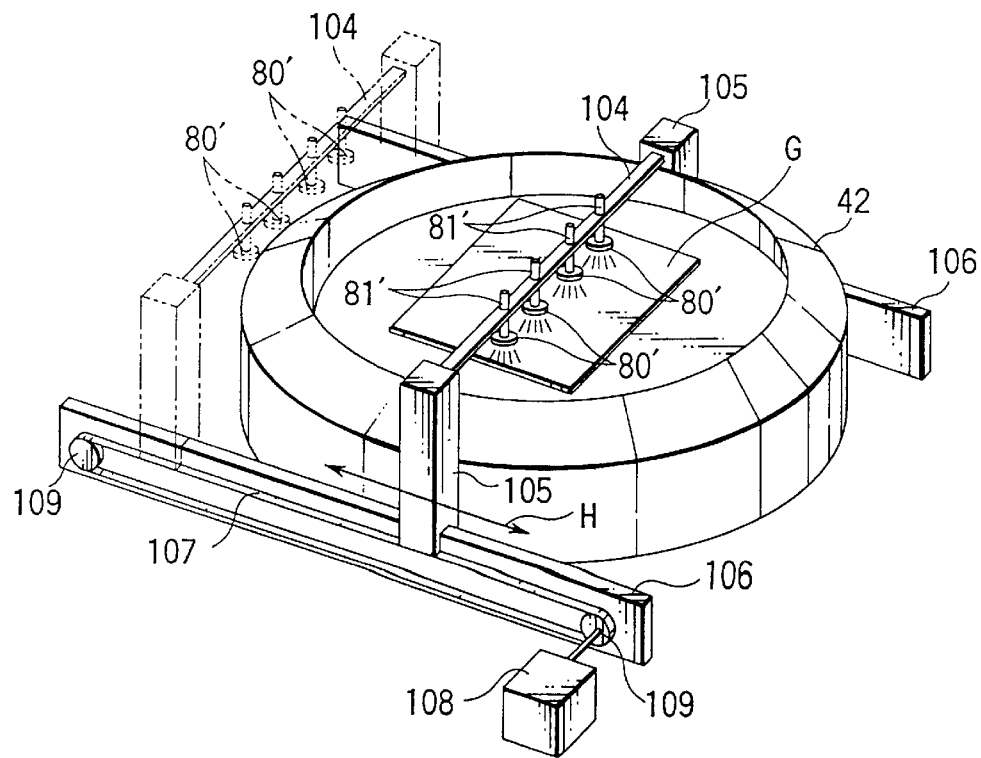
FIG. 4 is a perspective view showing a schematic configuration of the coating apparatus having a plurality of resist liquid supply nozzles as well as a scanning mechanism for resist liquid supply nozzles.

The case where a plurality of resist liquid supply nozzles 80' are provided to spray the resist liquid from respective nozzles will be explained herein. As shown in FIG. 4, a pair of shafts 105 which are movable in a direction indicated by an arrow H are provided so as to put the rotation cup 42 therebetween. Four resist liquid supply nozzles 80' are supported by a supporting member 104 which is built between both shafts 105. Supply of the resist liquid to the resist liquid supply nozzles 80' can be performed via a resist liquid supply tubes 81'. A pair of guiding members 106 for guiding the shafts 105 respectively are provided on the outside of the rotation cup 42. A pair of pulleys 109 are provided on the outside of the guiding members 106 respectively and a belt 107 is wound on the pulleys 109. The shaft 105 is secured to the belt 107 and one of the pulleys 109 is fitted to a rotation axis of a motor 108. Therefore, according to the rotation of the motor 108, a pair of shafts 105 can be moved along the direction indicated by the arrow H via a belt drive while being guided along the guide rails 106 and accordingly the resist liquid supply nozzles 80' supported by the supporting member 104 can be moved along the direction H indicated by the arrow H. Unless the resist liquid is coated, the resist liquid supply nozzles 80' is moved to the escape position which is remote from the substrate G and shown by a chain double-dashed line. In addition to such parallel displacement of the resist liquid supply nozzles 80', the substrate G may be rotated.

In this case, since a plurality of resist liquid supply nozzles 80' are provided, the resist liquid can be sprayed effectively on the overall surface of the substrate G. The resist liquid may be sprayed in various directions by employing a configuration which enables the resist liquid supply nozzles 80' to rotate individually or integrally. In this event, the solvent supply nozzles may be provided separately from the resist liquid supply nozzles, otherwise some of the plurality of nozzles may be utilized as the solvent supply nozzles so as to supply the solvent and the resist liquid, as described above.

Figure 5:
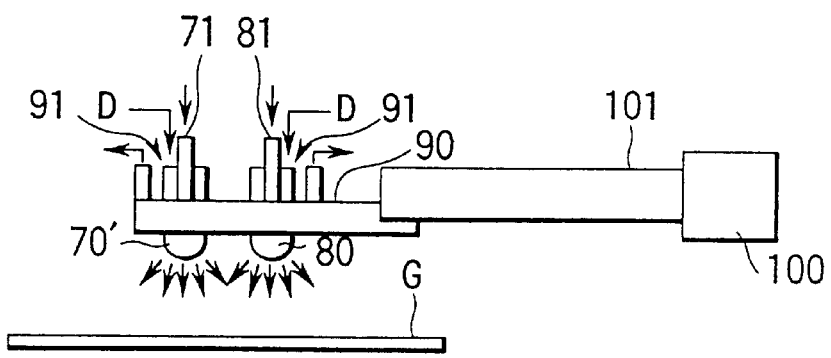
FIG. 5 is a schematic view showing an injection head having a spray type solvent supply nozzle.
Figure 6:
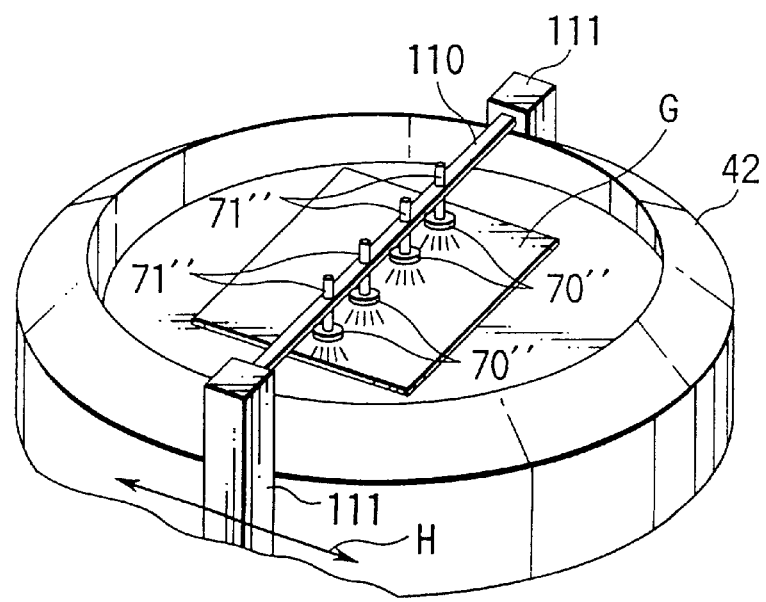
FIG. 6 is a perspective view showing a schematic configuration of the coating apparatus having a plurality of spray type solvent supply nozzles.

Next, another example of the solvent supply nozzle will be explained. The usual drop type nozzle has been employed in the above embodiment. In this example, as shown in FIG. 5, a spray type solvent supply nozzle 70' is employed. If the spray type solvent supply nozzle is employed in this way, wettability can be improved by coating the solvent A uniformly on the surface of the substrate G with the use of a less amount of the solvent. In addition, as shown in FIG. 6, a plurality of spray type solvent supply nozzles 70" may be provided. In this case, a pair of shafts 111 which are movable in the direction indicated by the arrow H so as to put the rotation cup 42 therebetween are provided, and four spray type solvent supply nozzles 70" are supported by the supporting member 110 which is bridged between both shafts 111. Supply of the solvent to respective nozzles 70" can be effected via solvent supply tubes 71". In this manner, by providing a plurality of spray type solvent supply nozzles 70", the solvent can be sprayed effectively on the overall surface of the substrate G. The resist liquid may be sprayed in various directions by employing a configuration which enables the resist liquid supply nozzles 80' to rotate individually or integrally. In addition to such parallel displacement of the resist liquid supply nozzles 80', the substrate G may be rotated.

Figure 7:
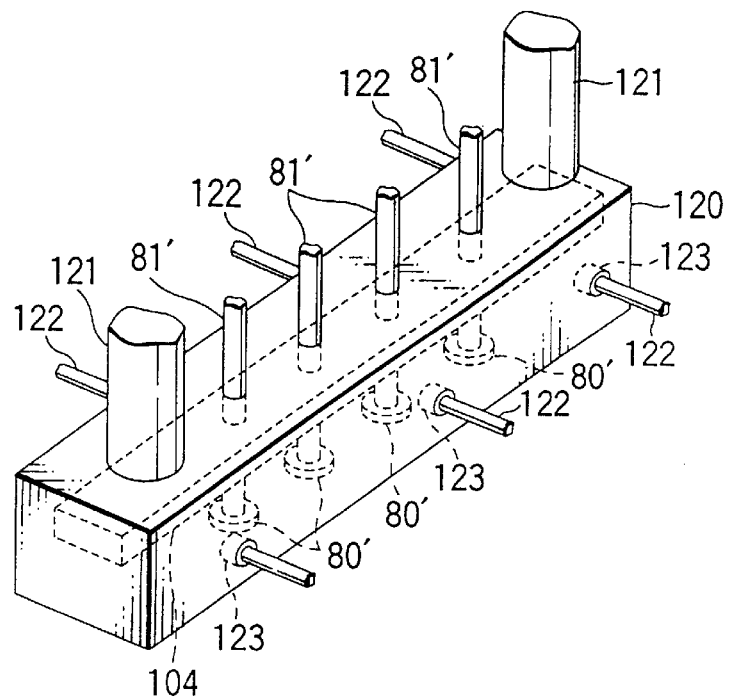
FIG. 7 is a perspective view showing a state wherein a plurality of resist liquid supply nozzles are covered with a cover.

The resist liquid is sprayed to be supplied to the substrate G in the present embodiment. However, in case the resist liquid is sprayed in this fashion, it is likely that the mist-like resist liquid scatters thereover and then adheres to peripheral areas of the substrate. In order to prevent this, as shown in FIG. 7, it is effective to cover the resist liquid supply nozzles with a cover 120. Here a state is shown wherein a plurality of resist liquid supply nozzles 80' shown in FIG. 3 are covered with a cover 120. A plurality of resist liquid supply tubes 81' are inserted into the inside from an upper surface of the cover 120, and thus the resist liquid is sprayed from the nozzles 80' in the cover 120. In addition, two exhaust ducts 121 are connected to the upper surface of the cover 120 to enable exhaust the inside of the cover 120. Moreover, a plurality of cleaning nozzles 123 are inserted into the cover 120 from a side surface of the cover 120, so that a cleaning liquid, e.g., thinner can be injected from cleaning liquid tubes 122 which are connected to the cleaning nozzles 123. Accordingly, the resist adhered to the inner surface of the cover 120 can be rinsed off and as a consequence the dried resist can be prevented from scattering as particles.

Figure 8:
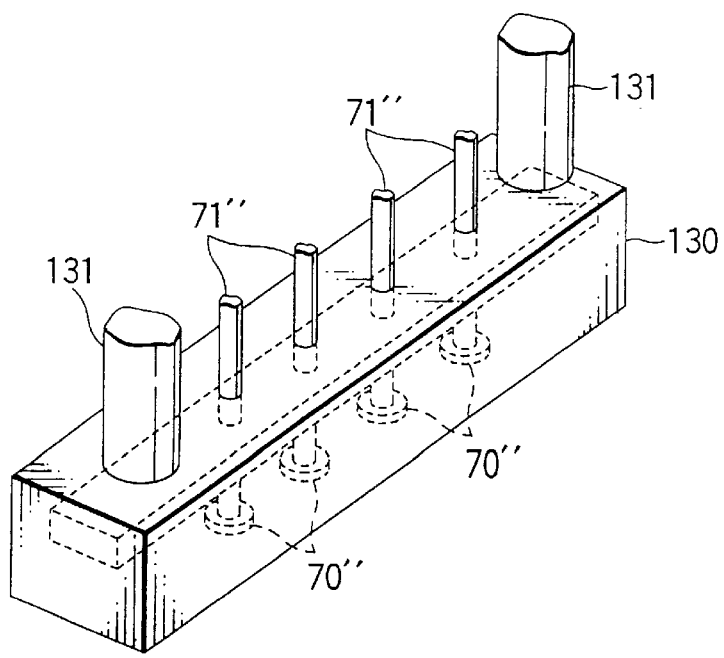
FIG. 8 is a perspective view showing a state wherein a plurality of spray type solvent supply nozzles are covered with a cover.

Furthermore, in the case of the solvent spraying, similarly the solvent scatters about the peripheral portion like the mist. In order to prevent this, as shown in FIG. 8, it is effective to cover the solvent supply nozzles with a cover 130. Here a state is shown wherein a plurality of solvent supply nozzles 70" shown in FIG. 6 are covered with a cover 130. A plurality of resist liquid supply tubes 71" are inserted into the inside from an upper surface of the cover 130, and thus the solvent is sprayed from the solvent supply nozzles 70" in the cover 130. In addition, two exhaust ducts 131 are connected to the upper surface of the cover 130 to enable exhaust the inside of the cover 130.

Figure 9:
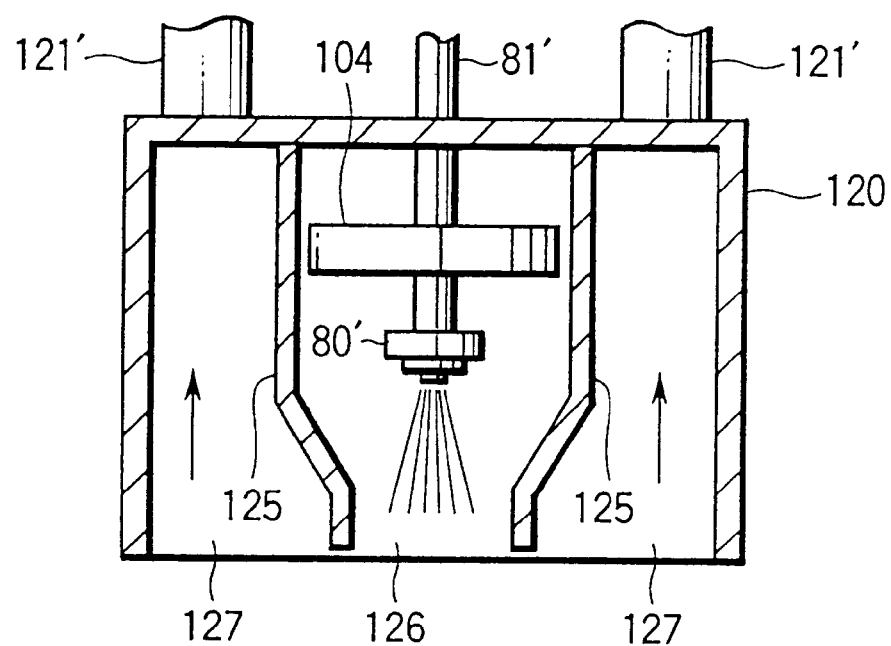
FIG. 9 is a sectional view showing another example of a cover for covering a plurality of resist liquid supply nozzles.

As shown in FIG. 9, partitions 125 may be provided in the cover 120 for the resist supply nozzle 80' to separate a central spraying area 126 from exhaust areas 127 on both outer sides. Exhaust ducts 121' are connected to the exhaust areas 127 respectively to exhaust the air therein via the exhaust ducts 121'. In such configuration, scattering of the resist being sprayed from the nozzle 80' to the surrounding areas can be prevented more effectively by exhausting the exhaust areas 127. Such configuration can be applied similarly to the cover 130 for the solvent supply nozzle 70".

The present invention is not limited to the above embodiments and various embodiments may be applied. For example, the substrate together with the processing vessel has been rotated in the above embodiments, but only the substrate may be rotated. Further, although the rotation cup has been closed by the lid member to regulate the thickness of the resist, such rotation cup should not always be closed by the lid member. Furthermore, in the above embodiments, the explanation has been made to the case where the present invention is applied to the resist coating unit 25 and the resist liquid is used as the coating liquid. However, the same advantages can be achieved if the present invention is applied to the developing unit 29 and the liquid developer is used as the coating liquid, and other coating liquid may be employed. Still more, the present invention may be applicable without the limitation to the resist coating/developing system. Moreover, although the case has been discussed where the LCD substrate is used as the to-be-processed body in the above embodiments, the present invention is not limited to this and applicable to coating film formation on other substrate such as the semiconductor wafer, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating film forming method for forming a coating film by supplying a coating liquid onto a surface of a substrate which is loaded in a processing vessel, comprising the steps of:
   (a) coating the coating liquid on the surface of the substrate by spraying the coating liquid from nozzle means onto the surface thereof and allowing said nozzle means to scan along the surface of the substrate while not rotating the substrate, to thus form the coating film;
   (b) sealing the substrate into the processing vessel by closing the processing vessel by means of a lid member after the step (a); and
   (c) regulating a film thickness of the coating film while rotating the substrate together with the processing vessel.

2. A coating film forming method for forming a coating film by supplying a coating liquid onto a surface of a substrate which is loaded in a processing vessel, comprising the steps of:
   (A) coating the coating liquid on the surface of the substrate by spraying the coating liquid from nozzle means onto the surface thereof and allowing said nozzle means to scan along the surface of the substrate while not rotating the substrate;
   (B) forming the coating film by spreading the coating liquid over the surface of the substrate while rotating the substrate at a first revolution speed;
   (C) sealing the substrate into the processing vessel by closing the processing vessel by means of a lid member after the step (B); and
   (D) regulating a film thickness of the coating film while rotating the substrate which is sealed in the processing vessel, at a second revolution speed which is higher than the first revolution speed.

3. The method according to claim 2, wherein, in said step (D), the substrate together with the processing vessel is rotated.

4. A coating film forming method for forming a coating film by supplying a coating liquid onto a surface of a substrate which is loaded in a processing vessel, comprising the steps of:
   (1) coating a solvent on the surface of the substrate;
   (2) coating the coating liquid on the surface of the substrate by spraying the coating liquid from nozzle means onto the surface thereof and allowing said nozzle means to scan along the surface of the substrate, to thus form the coating film;
   (3) sealing the substrate into the processing vessel by closing the processing vessel by use of a lid member after the step (2); and
   (4) regulating a film thickness of the coating film by rotating the substrate.

5. The method according to claim 4, wherein, in said step (4), the substrate together with the processing vessel is rotated.

6. The method according to claim 4, wherein, in said step (1) or (2), at least one of the solvent and the coating liquid is coated on the surface of the substrate while rotating the substrate and the processing vessel at a first revolution number.

7. The method according to claim 4, wherein, in said step (1), the solvent is sprayed onto the surface of the substrate.

8. A coating film forming method for forming a coating film by supplying a coating liquid onto a surface of a substrate which is loaded in a processing vessel, comprising the steps of:
   (I) coating a solvent on the surface of the substrate;
   (II) coating the coating liquid onto the surface of the substrate by spraying the coating liquid from nozzle means onto the surface of the substrate and allowing said nozzle means to scan along the surface of the substrate;
   (III) forming the coating film by spreading the coating liquid on the surface of the substrate while rotating the substrate at a first revolution speed;
   (IV) sealing the substrate into the processing vessel by closing the processing vessel by use of a lid member after the step (III); and
   (V) regulating a film thickness of the coating film by rotating the substrate which is sealed in the processing vessel, at a second revolution speed which is higher than the first revolution speed.

9. The method according to claim 8, wherein, in said step (IV) the substrate together with the processing vessel is rotated.

10. The method according to claim 8, wherein, in said step (I) or (II), at least one of the solvent and the coating liquid is coated on the surface of the substrate while rotating the substrate and the processing vessel at a first revolution speed.

11. The method according to claim 8, wherein, in said step (I), the solvent is sprayed onto the surface substrate.

12. A coating apparatus for forming a coating film by supplying a coating liquid onto a surface of a substrate which is loaded in a processing vessel, comprising;
   a processing vessel formed like a cup shape with an opening portion so as to surround the substrate;
   a vessel rotating means for rotating the processing vessel together with the substrate;
   a lid member for closing an opening portion of the processing vessel;
   a supporting means for supporting the substrate in a state where the surface of the substrate is kept horizontally;
   a substrate rotating means rotating the substrate by rotating the supporting means;
   a coating liquid spraying means for spraying the coating liquid onto the surface of the substrate; and
   a scanning means for scanning the coating liquid spraying means along the surface of the substrate.

13. The apparatus according to claim 12, wherein said coating liquid spraying means includes a plurality of spray nozzles which are equal in diameter and are substantially arranged in a line at even intervals, and said plurality of spray nozzles are moved along the substrate by said scanning means.

14. The apparatus according to claim 12, further comprising a cover having side portions for surrounding said plurality of spray nozzles and an upper portion for covering said plurality of spray nozzles from above.

15. The apparatus according to claim 14, further comprising an exhaust portion being provided on the upper portion of said cover.

16. The apparatus according to claim 15, further comprising partition walls provided inside the cover for separating said spray nozzles from said exhaust portion.

17. The apparatus according to claim 14, further comprising cleaning nozzles provided on the side portions of said cover for cleaning an inside of the cover.

18. A coating apparatus for forming a coating film by supplying a coating liquid onto a surface of a substrate which is loaded in a processing vessel, comprising:
- a processing vessel formed to have a cup shape with an opening portion so as to surround the substrate;
- a lid member for closing an opening portion of the processing vessel;
- a supporting means for supporting the substrate in a state where the surface of the substrate is kept horizontally;
- a substrate rotating means for rotating the substrate by rotating the supporting means;
- a coating liquid spraying means for spraying the coating liquid onto the surface of the substrate;
- a coating liquid cover having an exhaust portion, for covering the coating liquid spraying means;
- a solvent supplying means for supplying a solvent for the coating liquid onto the surface of the substrate; and
- a scanning means for scanning the coating liquid spraying means along the surface of the substrate.

19. The apparatus according to claim 18, further comprising a vessel rotating means for rotating the substrate together with the processing vessel.

20. The apparatus according to claim 18, wherein the coating liquid spraying means includes a plurality of coating liquid spraying portions.

21. The apparatus according to claim 18, further comprising partition walls for separating the exhaust portion from the coating liquid spraying means.

22. The apparatus according to claim 18, further comprising a cleaning means for cleaning an inside of the coating liquid cover.

23. The apparatus according to claim 18, wherein the solvent supplying means supplies the solvent by spraying it.

24. A coating apparatus for forming a coating film by supplying a coating liquid onto a surface of a substrate which is loaded in a processing vessel, comprising:
- a processing vessel formed to have a cup shape with an opening portion so as to surround the substrate;
- a supporting means for supporting the substrate in a state where the surface of the substrate is kept horizontally;
- a substrate rotating means for rotating the substrate by rotating the supporting means;
- a coating liquid spray means for spraying the coating liquid onto the surface of the substrate;
- a solvent supplying means for spraying a solvent for the coating liquid onto the surface of the substrate; and
- a solvent cover for covering the solvent supplying means.

25. The apparatus according to claim 24, wherein the solvent cover includes an exhaust portion.

26. The apparatus according to claim 25, further comprising partition walls for separating the exhaust portion from the coating liquid spraying means.

* * * * *